United States Patent
Liu et al.

(10) Patent No.: US 9,203,405 B2
(45) Date of Patent: Dec. 1, 2015

(54) LOW-POWER INTERNAL CLOCK GATED CELL AND METHOD

(71) Applicant: Taiwan Semiconductor Manufacturing Co., Ltd., Hsin-Chu (TW)

(72) Inventors: Chi-Lin Liu, New Taipei (TW); Shang-Chih Hsieh, Yangmei (TW); Lee-Chung Lu, Taipei (TW); Meng-Hsueh Wang, Hsinchu (TW); Chang-Yu Wu, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/277,896

(22) Filed: May 15, 2014

(65) Prior Publication Data
US 2015/0162910 A1    Jun. 11, 2015

Related U.S. Application Data (60) Provisional application No. 61/913,986, filed on Dec. 10, 2013.

(51) Int. Cl.
*G06F 1/04* (2006.01)
*H03K 19/00* (2006.01)
*H03K 3/033* (2006.01)

(52) U.S. Cl.
CPC .......... *H03K 19/0016* (2013.01); *H03K 3/033* (2013.01); *H03K 19/0013* (2013.01)

(58) Field of Classification Search
CPC ......... H03K 3/033; H03K 3/037; H03K 5/06; H03K 5/13; H03K 5/133; H03K 5/1534; H03K 5/1565; H03K 19/00361; G06F 1/04
USPC ......... 327/176, 276, 278, 172, 291, 191, 299, 327/293, 261, 263, 264, 270, 275; 326/93–98
See application file for complete search history.

(56) References Cited

U.S. PATENT DOCUMENTS

| | | | |
|---|---|---|---|
| 5,345,421 A * | 9/1994 | Iwamura et al. | 365/189.05 |
| 5,744,983 A * | 4/1998 | Bazes | 327/3 |
| 6,275,968 B1 * | 8/2001 | Dean et al. | 716/109 |
| 6,317,369 B1 * | 11/2001 | Kubo et al. | 365/193 |
| 7,319,355 B2 * | 1/2008 | Wu et al. | 327/291 |
| 8,552,785 B2 * | 10/2013 | Kuo et al. | 327/291 |
| 2013/0113537 A1 * | 5/2013 | Kuo et al. | 327/176 |
| 2014/0355365 A1 * | 12/2014 | Jung et al. | 365/191 |

* cited by examiner

*Primary Examiner* — Vibol Tan
(74) *Attorney, Agent, or Firm* — Duane Morris LLP (57) ABSTRACT

A circuit includes a clock trigger block and a logic circuit. The logic circuit is configured to output a signal to the clock trigger block based on a logic level of an enable signal received at the logic circuit. The clock trigger block is configured to output an output signal response to a clock signal received at the clock trigger block and the signal received from the logic circuit.

18 Claims, 7 Drawing Sheets

LOW-POWER INTERNAL CLOCK GATED CELL AND METHOD

CROSS-REFERENCE TO RELATED APPLICATIONS

This application claims priority to U.S. Provisional Patent Application No. 61/913,986, filed Dec. 10, 2013, the entirety of which is incorporated by reference herein.

BACKGROUND

The disclosed circuits and methods relate to integrated circuits. More particularly, the disclosed circuits and methods relate to clock gated cells for integrated circuits. Clock gated cells frequently are included in many system-on-chip ("SOC") architectures in order to reduce the amount of power consumed by the system. However, many conventional clock gated cells are inefficient and waste considerable power themselves.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The disclosed circuits and methods advantageously reduce the power consumed by an internal clock gate ("ICG") cell. The reduced power is achieved by reducing the number of gates that are toggled when an enable signal is not off, i.e., is not enabled.

Figure 1:
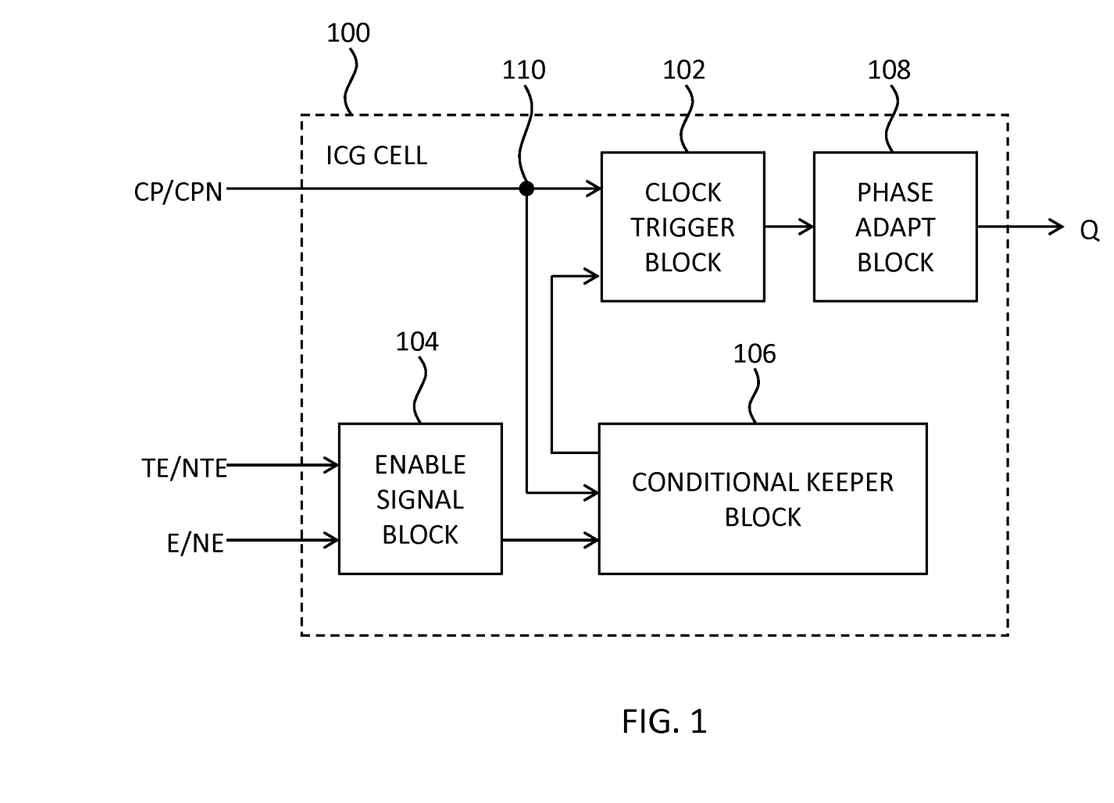
FIG. 1 is a block diagram of one example of an internal clock gate cell in accordance with some embodiments.

FIG. 1 is a block diagram of one example of an ICG cell 100 in accordance with some embodiments. As shown in FIG. 1, ICG cell 100 includes a clock trigger block 102, an enable signal block 104, a conditional keeper block 106, and a phase adapt block 108. Clock trigger block 102 is coupled to node 110, which is also coupled to condition keeper block 106. In some embodiments, the clock-trigger block 102 is configured to be positive- or negative-edge triggered.

More particularly, clock trigger block 102 and conditional keeper block 106 are configured to receive at least one clock pulse ("CP") and/or complementary clock pulse ("CPN") signals via node 110. Enable signal block 104 is configured to receive one or more test enable ("TE") and/or complementary test enable ("NTE") signals as well as one or more enable ("E") and/or complementary enable ("NE") signals. The output(s) of enable signal block 104 is coupled to input(s) of conditional keeper block 106, which generates at least one output signal that is provided to clock trigger block 102 in response to the signals received from enable signal block 104 and from node 110. Clock trigger block 102 outputs at least one output signal to phase adapt block 108 in response to the signals received from node 110 and from conditional keeper block 106. Phase adapt block 108 outputs at least one output signal, Q, based on the signal(s) received from clock trigger block 102.

Figure 2A:
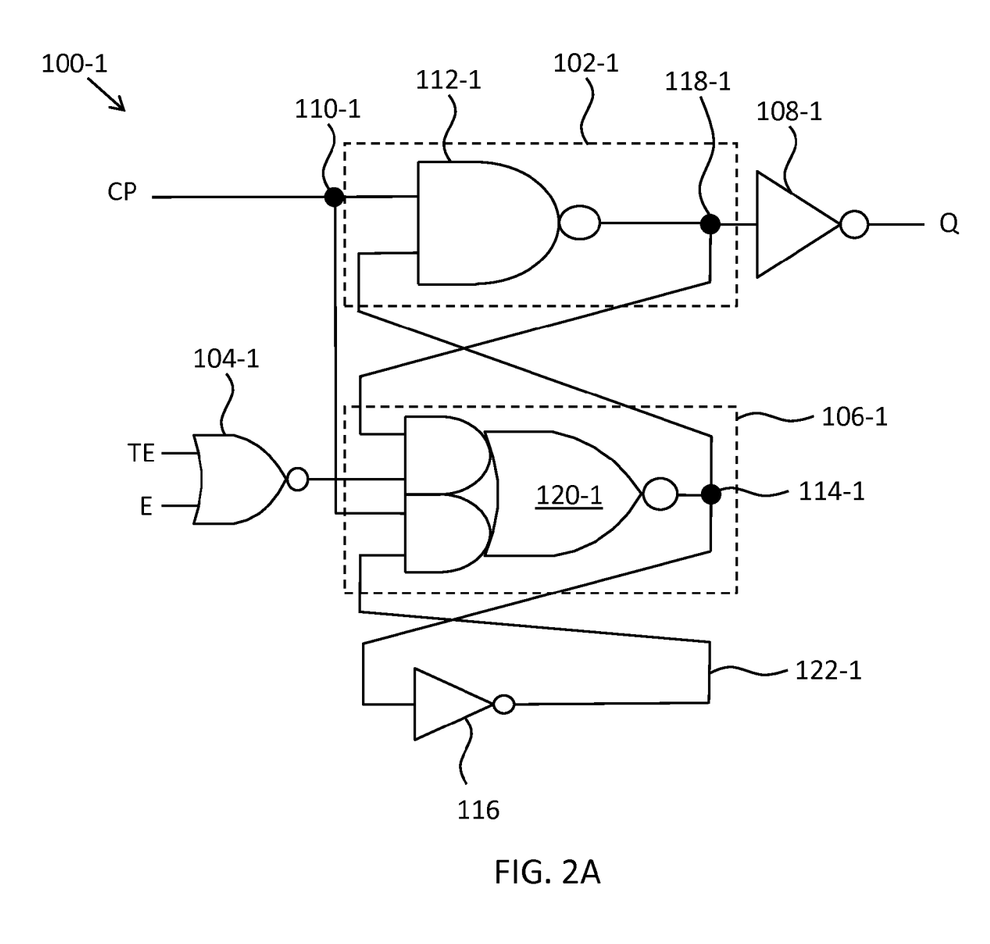
FIG. 2A is a circuit diagram of an internal clock gate cell in accordance with some embodiments.

FIG. 2A is a circuit diagram of one example of an ICG cell in accordance with some embodiments. The ICG cell 100-1 illustrated in FIG. 2A includes a clock trigger block 102-1 comprising a logic gate 112-1, which is illustrated as a NAND gate. Although logic gate 112-1 is illustrated as a NAND gate, one of ordinary skill in the art will understand that logic gate 112-1 can be implemented as another type of logic gate including, but not limited to, an AND gate, an OR gate, or a NOR gate to list only a few possible examples. A first input of logic gate 112-1 is coupled to node 110-1, which receives a CP signal and is also coupled to conditional keeper block 106-1 as noted above. A second input of logic gate 112-1 is coupled to node 114-1, which is coupled to the output of conditional keeper block 106-1 and to the input of an inverter 116. The output of logic gate 112-1 is coupled to node 118-1, which is coupled to another input of conditional keeper block 106-1 and to the input of an inverter of phase adapt block 108-1.

Conditional keeper block 106-1 includes AND-OR-invert ("AOI") logic 120-1 including four inputs. One input of a first AND gate of the AOI logic 120-1 is coupled to node 118-1, and the other input of the first AND gate of the AOI logic 120-1 is coupled to the output of a logic gate of enable signal block 104-1. In some embodiments, such as the embodiment illustrated in FIG. 2A, the logic gate of enable signal block 104-1 is implemented as a NOR gate; however, other types of logic gates can be implemented as the logic gate of enable signal block 104-1. One input of another AND gate of the AOI logic 120-1 is coupled to node 110-1 such that it receives the CP signal, and the other input of the other AND gate of the AOI logic 120-1 is coupled to node 122-1, which is coupled to the output of inverter 116. The logic gate of enable signal block 104-1 has a first input configured to receive a TE signal, and a second input configured to receive an E signal. The output, Q, of the inverter of phase adapt block 108-1 can be provided to other circuitry, such as a gated storage element (not shown).

Figure 2B:
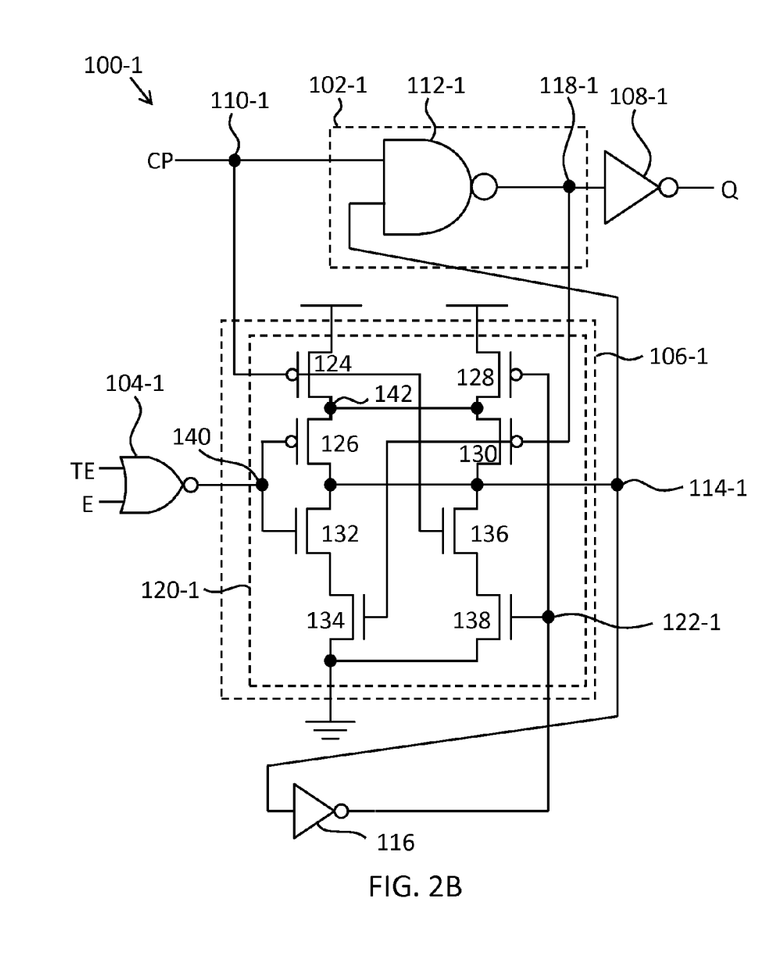
FIG. 2B is a more detailed circuit diagram of an internal clock gate cell in accordance with some embodiments.

FIG. 2B is a more detailed diagram of the ICG cell 100-1 illustrated in FIG. 2A. In particular, FIG. 2B illustrates a more detailed implementation of one example of AOI logic 120-1. As shown in FIG. 2B, AOI logic 120-1 includes a plurality of transistors of a first type (e.g., PMOS transistors) 124, 126, 128, 130 and a plurality of transistors of a second type (e.g., NMOS transistors) 132, 134, 136, 138.

Transistors 126 and 132 have their gates coupled together at node 140, which is coupled to the output of the logic gate of enable signal block 104-1. The drains of transistors 126 and 132 are coupled together at node 114-1, which is also coupled to the drains of transistors 130 and 136, to the input of inverter 116, and to an input of logic gate 112-1. The source of transistor 126 is coupled to the drain of transistor 124 at node 142. Transistor 124 has its source coupled to a first voltage supply and its gate coupled to node 110-1. Transistor 132 has its source coupled to the drain of transistor 134, which has its source coupled to a second voltage supply and its gate coupled to the gate of transistor 130 and to node 118-1. In some embodiments, the first voltage supply is VDD or VSS and the second voltage supply is ground.

Transistor 128 has its source coupled to the first voltage supply, its drain coupled to the source of transistor 130 at node 142, and its gate coupled to node 122-1. Transistor 130 has its drain coupled to the drain of transistor 136 at node 114-1. Transistor 136 has its gate coupled to the gate of transistor 124 and to node 110-1. The source of transistor 136 is coupled to the drain of transistor 138, which has its source coupled to the second voltage supply and its gate coupled to node 122-1.

Figure 2C:
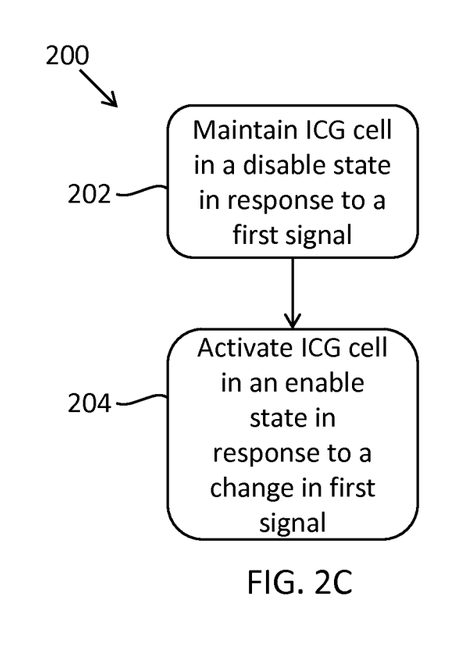
FIG. 2C is a flow diagram of one example of a method of operation of an internal clock gate cell in accordance with FIGS. 2A and 2B.

The operation of an ICG cell in accordance with the present disclosure is now described with reference to FIGS. 2A-2C in which FIG. 2C is a flow diagram of one example of a method. As shown in FIG. 2C, the ICG cell 100-1 is placed and/or maintained in a disabled state in response to a first signal at block 202. In some embodiments, for example, the first signal is an enable signal that is a logic zero level; however, the enable signal can be a logic one in some embodiments. In this disabled state, the number of circuit elements, e.g. transistors, that toggle or change state in response to the clock pulse CP is fewer than half of the active devices of ICG cell, e.g., four active devices. For example, with ICG block 100-1 disabled, the voltage at node 140-1, i.e., V140, is a logic high due to the inputs of logic gate 104 both being logic lows. As the clock pulse CP pulses, i.e., oscillates between logic highs and logic lows, transistors 124 and 136 are toggled in response to the voltage across their respective gates changing.

Two transistors of logic gate 112-1 are also toggled in response to the clock pulse CP. For example, the voltage at node 114-1, i.e., V114, is a logic low when V140 is a logic high due to the inverter formed by transistors 126 and 132. However, in embodiments in which logic gate 112-1 is a NAND gate, the output of the logic gate 112-1, i.e., V118, does not change due to the truth table of the NAND gate. Consequently, only two transistors of logic gate 112-1 change their orientation, i.e., the two transistors having their gates coupled to receive the CP signal.

At block 204, the ICG cell is activated. In some embodiments, the ICG cell 100-1 is activated in response to the first signal, e.g., the enable signal, changing its logic level. The operation of the ICG cell 100-1 when enabled is described with reference to FIGS. 2A, 2B, and 2D in which FIG. 2D is one example of a timing diagram of an ICG cell in accordance with some embodiments.

Figure 2D:
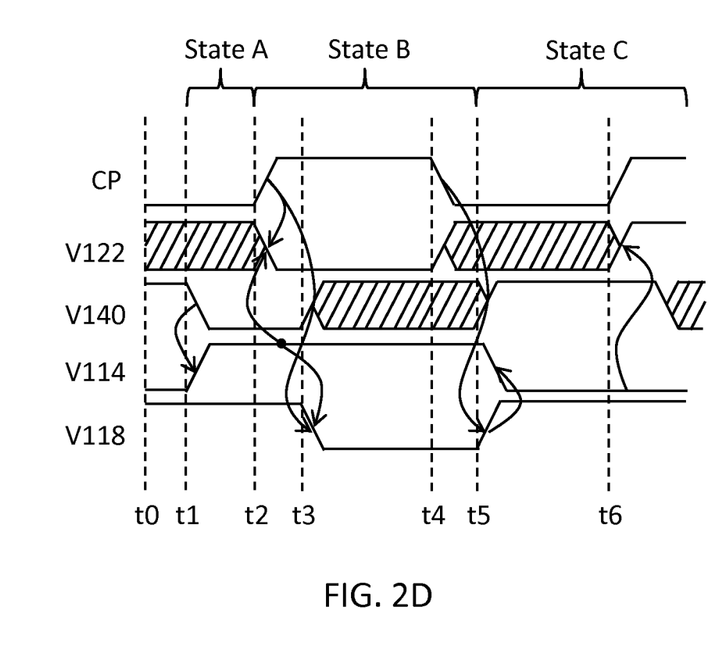
FIG. 2D is a timing diagram of various signals of an internal clock gate illustrated in FIGS. 2A and 2B.

As shown in FIG. 2D, initially at time t0, the ICG cell 100-1 is in the disabled state in which the voltage at node 122-1, i.e., V122 does not affect any other signals in the ICG cell 100. At time t1, the ICG cell 100-1 transitions from disable to enabled state A. With the CP signal low at time t1 and the enable signal changing its logic state, the output of logic gate 104-1, i.e., V140, changes from a logic one to a logic zero, and the change in V140 causes a change in the logic level of V114. For example, the inverter formed by transistors 126 and 132 inverts the logic zero output by logic gate 104-1 to a logic one at node 114-1 by coupling node 114-1 to VDD through transistors 126 and 124. Transistor 124 is turned on, or in a current-conducting state, due to the low logic level of CP at its gate.

At time t2, the CP signal transitions from logic low to logic high, which signals the end of state A, the beginning of state B, and causes V118 to transition to a logic low at time t3. For example, the logic level of V122, which is the inverse of the logic level of V114 by virtue of inverter 116, becomes relevant to ICG cell 100 at time t2. With V114 a logic high, V122 is a logic low as shown at time t2 in FIG. 2D. The high logic level of V114 while CP also is a logic high causes logic gate 112-1 to change its output (V118) from a high logic level to a low logic level at time t3.

Enabled state B continues from time t2 to time t5. Between times t3 and t5, V140 does not affect the other signals of ICG cell 100-1. At time t4, the CP signal transitions from a high logic level to a low logic level resulting in a change in the output of logic gate 112-1 (i.e., V118) at time t5. The logic level of V112 is not relevant between times t4 and t6.

Disabled state C begins at time t6 when the CP signal transitions for a logic low to a logic high. When the CP signal transitions at time t6 it results in the logic level of V122, which is the output of inverter 116, being relevant. The logic level of V122 will be a high logic level as the logic level of V114, which is input into inverter 116, is a low logic level.

As described above, only four devices (e.g., transistors) are toggled when the enable signal, E, is a logic low, i.e., zero. For example and referring again to FIG. 2B, when the enable signal, E, is a logic low, transistors 124, 136, and two transistors of logic gate 112-1 are toggled in response to other signals propagating through ICG cell 100-1. By reducing the amount of devices that are toggled when the enable signal is low, the amount of power consumed by ICG cell is reduced. In some embodiments, the power improvement is as much as 57% and the CP-pin capacitance is reduced by 24%. Further, the power improvement is achieved without suffering an area penalty (with less than 12% area cost).

Figure 3:
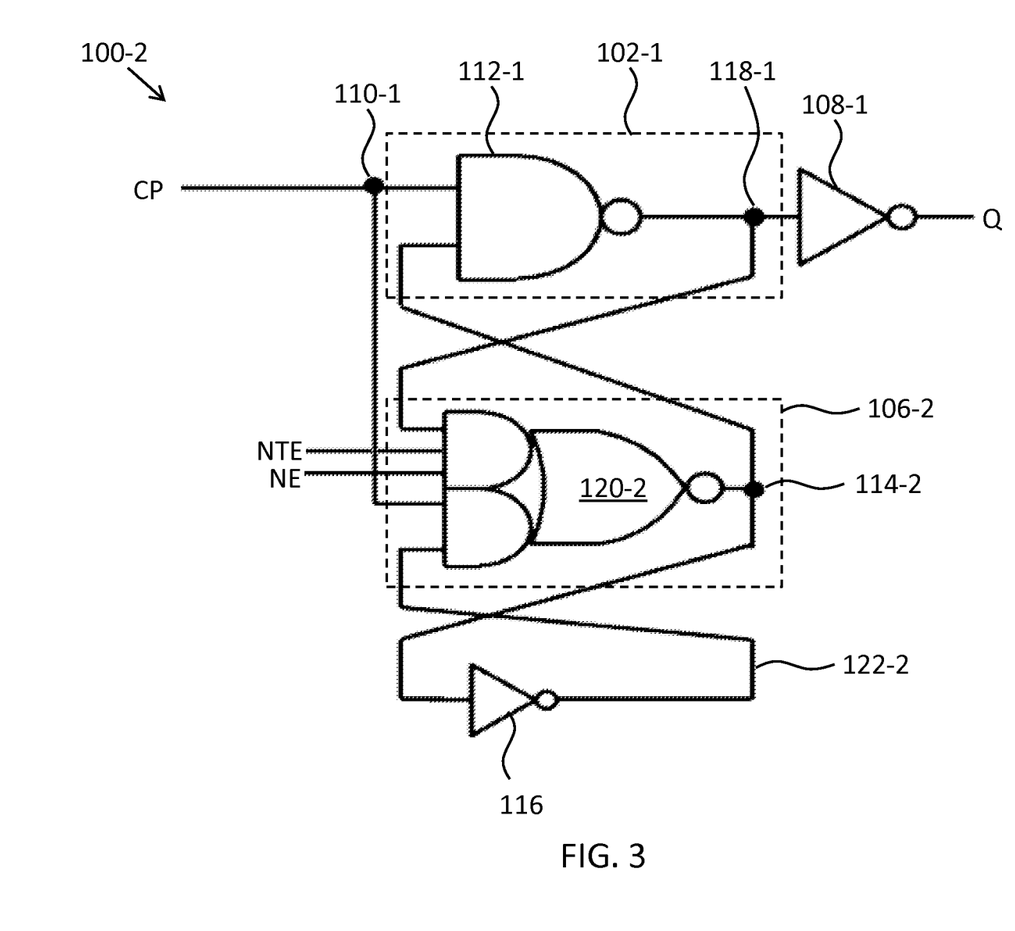
FIG. 3 is a circuit diagram of another example of an internal clock gate cell in accordance with some embodiments.

FIG. 3 illustrates another example of a ICG cell 100-2 in accordance with some embodiments. ICG cell 100-2 includes a clock trigger block 102-1 comprising a logic gate 112-1. In some embodiments, logic gate 112-1 is implemented as a NAND gate. A first input of logic gate 112-1 is coupled to node 110-1, which receives complementary clock pulse signal CP. Node 110-1 is also coupled to conditional keeper block 106-2. A second input of logic gate 112-1 is coupled to node 114-2, which is coupled to the output of conditional keeper block 106-2 and to the input of inverter 116. The output of logic gate 112-1 is coupled to node 118-1, which is coupled to another input of conditional keeper block 106-2 and to the input of an inverter of phase adapt block 108-1.

Conditional keeper block 106-2 includes AOI logic 120-2, which has five inputs. One input of a first AND gate of the AOI logic 120-2 is coupled to node 118-1, and the other two inputs are configured to receive signals NTE and NE respectively. One input of another AND gate of the AOI logic 120-2 is coupled to node 110-1, and the other input of the another AND gate of the AOI logic 120-2 is coupled to node 122-2, which is coupled to the output of inverter 116. The output, Q, of the inverter of phase adapt block 108-1 can be provided to other circuitry, such as a gated storage element (not shown). In some embodiments, the ICG cell 100-2 is a positive-edge triggered circuit as will be understood by one of ordinary skill in the art.

Figure 4:
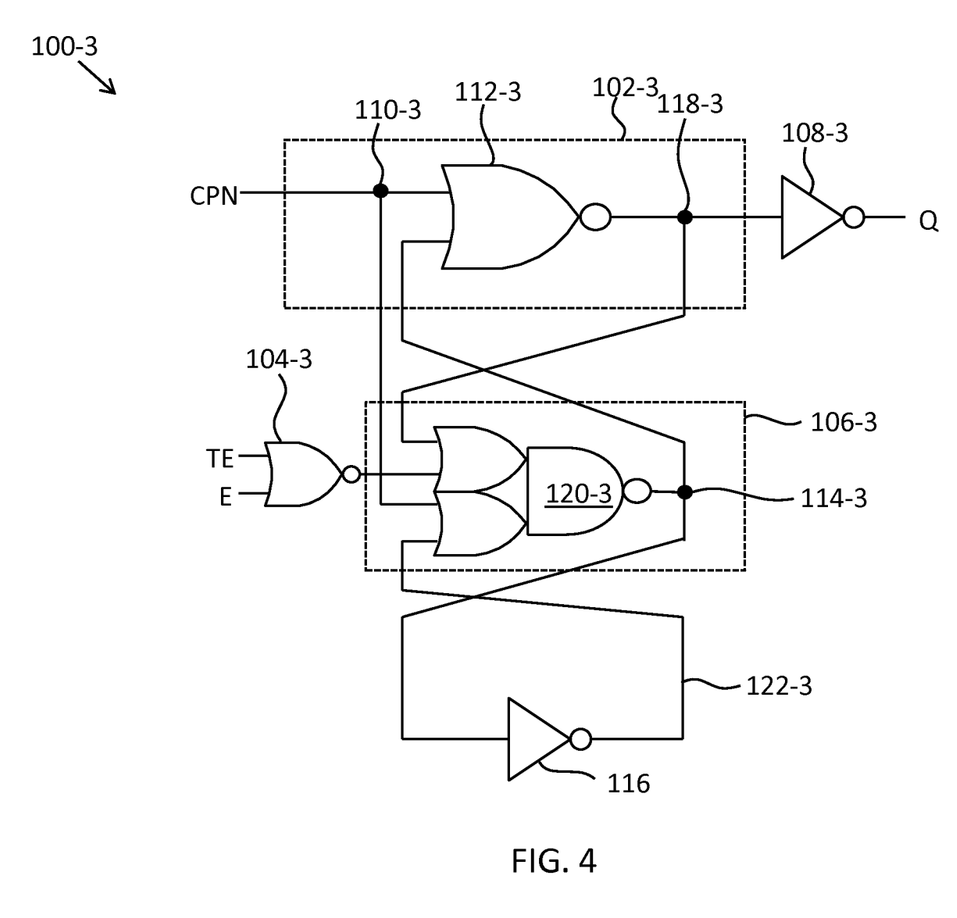
FIG. 4 is a circuit diagram of another example of an internal clock gate cell in accordance with some embodiments.

FIG. 4 is another example of an ICG cell 100-3 in accordance with some embodiments. ICG cell 100-3 includes a clock trigger block 102-3 comprising a logic gate 112-3, which is illustrated as a NOR gate. One input of logic gate 112-3 is coupled to node 110-3, which receives the CPN signal. Node 110-3 also is coupled to condition keeper block 106-3. Another input of logic gate 112-3 is coupled to node 114-3, which is coupled to the output of conditional keeper block 106-3 and to inverter 116. The output of logic gate 112-3 is coupled to node 118-3, which is coupled to another input of condition keeper block 106-3 and to the input of an inverter of phase adapt block 108-3.

Conditional keeper block 106-3 includes complex logic such as, for example, an OR-AND-invert ("OAI") logic block 106-3. In some embodiments, such as the embodiment illustrated in FIG. 4, OAI logic block 106-3 includes four inputs. One input of OAI logic 120-3 is coupled to node 118-3, and another input of OAI logic 120-3 is coupled to the output of a logic gate of enable signal block 104-3, which is illustrated as an OR gate. Another input of OAI logic 120-3 is coupled to node 110-3, and another input of OAI logic 120-3 is coupled to node 122-3. Node 122-3 is coupled to the output of inverter 116. The logic gate of enable signal block 140-3 receives signals E and TE. The output, Q, of the inverter of phase adapt block 108-3 can be provided to other circuitry, such as a gated storage element (not shown).

Figure 5:
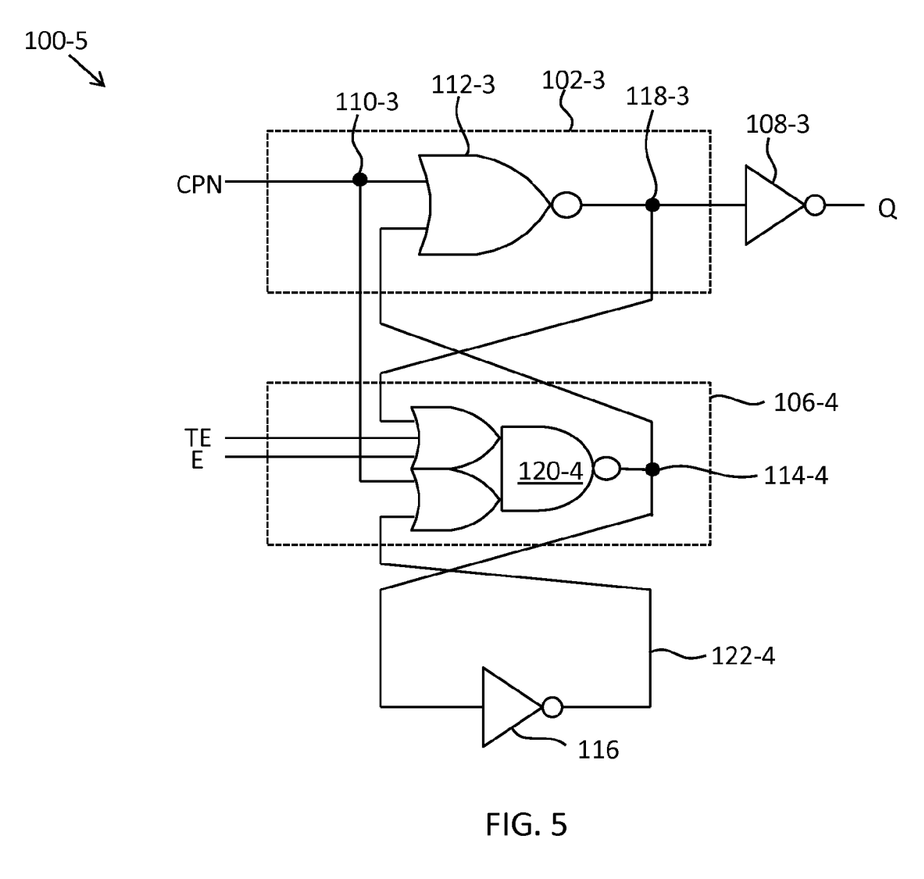
FIG. 5 is a circuit diagram of another example of an internal clock gate cell in accordance with some embodiments.

FIG. 5 illustrates another example of a ICG cell 100-4 in accordance with some embodiments. ICG cell 100-5 includes a clock trigger block 102-3. comprising a logic gate 112-3. In some embodiments, logic gate 112-3 is implemented as a NOR gate. A first input of logic gate 112-3 is coupled to node 110-3, which receives clock pulse signal CPN. Node 110-3 is also coupled to conditional keeper block 106-4. A second input of logic gate 112-3 is coupled to node 114-4, which is coupled to the output of conditional keeper block 106-4 and to the input of inverter 116. The output of logic gate 112-3 is coupled to node 118-3, which is coupled to another input of conditional keeper block 106-4 and to the input of an inverter of phase adapt block 108-3.

Conditional keeper block 106-4 includes OAI logic 120-4, which has five inputs. One input of OAI logic 120-4 is coupled to node 118-3, and another two inputs are configured to receive signals TE and E, respectively. Another input of OAI logic 120-4 is coupled to node 110-3, and another input of OAI logic 120-4 is coupled to node 122-4, which is coupled to the output of inverter 116. The output, Q, of the inverter of phase adapt block 108-3 can be provided to other circuitry, such as a gated storage element (not shown).

The disclosed circuits and methods advantageously reduce the power consumed by an ICG cell. The reduction power consumed is achieved by reducing the number of gates that are toggled when an enable signal is not off, i.e., is not enabled. In some embodiments, fewer than half of the active devices of an ICG cell are toggled or switched when the ICG is not enabled resulting in a power improvement is as much as 57% and a reduction in CP-pin capacitance by 24%. Further, the power improvement is achieved without suffering an area penalty (with less than 12% area cost).

In some embodiments, a circuit includes a clock trigger block and a logic circuit. The logic circuit is configured to output a signal to the clock trigger block based on a logic level of an enable signal received at the logic circuit. The clock trigger block is configured to output an output signal response to a clock signal received at the clock trigger block and the signal received from the logic circuit.

In some embodiments, the clock trigger block includes a logic gate having a first input configured to receive the clock signal and a second input configured to receive the signal output from the logic circuit.

In some embodiments, the logic block includes one of AND-OR-invert logic and OR-AND-invert logic.

In some embodiments, the logic gate includes a first input coupled to an output of the clock trigger block, a second input configured to receive the logic level of the enable signal, a third input configured to receive the clock signal, and a fourth input coupled to an output of an inverter.

In some embodiments, the inverter has an input coupled to the output of the logic circuit.

In some embodiments, the circuit includes a phase adapt block coupled to the of the clock trigger block.

In some embodiments, the phase adapt block includes an inverter configured to invert the output signal.

In some embodiments, the circuit includes a plurality of active devices. When the circuit is not enabled, fewer than one half of the plurality of active devices toggle in response to the clock signal.

In some embodiments, the logic level of the enable signal received at the logic circuit is received from a logic gate having at least two inputs.

In some embodiments, a clock gate cell includes a clock trigger block, a conditional keeper block, and a phase adapt block. The conditional keeper block is configured to output a signal to the clock trigger block based on a logic level of an enable signal and the first oscillating clock signal. The phase adapt block is coupled to the output of the clock trigger block. The clock trigger block is configured to output a second oscillating clock signal to the phase adapt block in response to the first oscillating clock signal and the signal received from the logic circuit.

In some embodiments, the clock trigger block includes a logic gate having a first input configured to receive the first oscillating clock signal and a second input configured to receive the signal output from the logic circuit. The phase adapt block includes an inverter configured to invert the second oscillating clock signal.

In some embodiments, the conditional keeper block includes logic circuitry including a first input coupled to an output of the logic gate of the clock trigger block, a second input configured to receive a signal indicative of the logic level of the enable signal, a third input configured to receive the first oscillating clock signal, and a fourth input coupled to an output of a second inverter.

In some embodiments, the second inverter has an input coupled to the output of the logic circuitry.

In some embodiments, the logic circuitry of the conditional keeper block is coupled to an output of a second logic gate that receives the enable signal at an input thereof.

In some embodiments, the logic circuitry includes one of AND-OR-invert circuitry and OR-AND-invert circuitry.

In some embodiments, the clock gate cell includes a plurality of devices, and when the clock gate cell is not enabled, fewer than one half of the plurality of active devices toggle in response to the first oscillating clock signal.

In some embodiments, a method includes receiving a first clock signal at a clock gate cell and disabling a clock gate cell including a plurality of active devices such that fewer than one half of the plurality of active devices toggle in response to the first clock signal.

In some embodiments, the clock gate cell includes a clock trigger block configured to receive the first clock signal and a conditional keeper block configured to output a signal to the clock trigger block based on a logic level of an enable signal and the first clock signal.

In some embodiments, the method includes enabling the clock gate cell such that the clock gate cell outputs a second clock signal.

In some embodiments, the clock gate cell includes a phase adapt block coupled to the output of the clock trigger block.

The phase adapt block is configured to receive a third clock signal from the clock trigger block and to output the second clock signal in response.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
 a clock trigger block configured to receive a clock signal; and
 a logic circuit configured to output a signal to the clock trigger block based on a logic level of an enable signal received at the logic circuit,
 wherein the clock trigger block is configured to output an output signal in response to the clock signal and the signal received from the logic circuit, and
 wherein the logic circuit includes a plurality of transistors, and when the circuit is not enabled in response to the logic level of the enable signal, at least one but fewer than one half of the plurality of transistors toggle in response to the clock signal.

2. The circuit of claim 1, wherein the clock trigger block includes a logic gate having a first input configured to receive the clock signal and a second input configured to receive the signal output from the logic circuit.

3. The circuit of claim 2, wherein the logic block includes one of AND-OR-invert logic and OR-AND-invert logic.

4. The circuit of claim 2, wherein the logic block includes
 a first input coupled to an output of the clock trigger block,
 a second input configured to receive the logic level of the enable signal,
 a third input configured to receive the clock signal, and
 a fourth input coupled to an output of an inverter.

5. The circuit of claim 4, wherein the inverter has an input coupled to the output of the logic circuit.

6. The circuit of claim 1, further comprising a phase adapt block coupled to the of the clock trigger block.

7. The circuit of claim 6, wherein the phase adapt block includes an inverter configured to invert the output signal.

8. The circuit of claim 1, wherein the logic level of the enable signal received at the logic circuit is received from a logic gate having at least two inputs.

9. A clock gate cell, comprising:
 a clock trigger block configured to receive a first oscillating clock signal;
 a conditional keeper block configured to output a signal to the clock trigger block based on a logic level of an enable signal and the first oscillating clock signal; and
 a phase adapt block coupled to the output of the clock trigger block,
 wherein the clock trigger block is configured to output a second oscillating clock signal to the phase adapt block in response to the first oscillating clock signal and the signal received from the logic circuit, and
 wherein the conditional keeper block includes a plurality of transistors, and when the clock gate cell is not enabled in response to the logic level of the enable signal, at least one but fewer than one half of the plurality of transistors toggle in response to the first oscillating clock signal.

10. The clock gate cell of claim 9, wherein
 the clock trigger block includes a logic gate having a first input configured to receive the first oscillating clock signal and a second input configured to receive the signal output from the logic circuit, and
 the phase adapt block includes an inverter configured to invert the second oscillating clock signal.

11. The clock gate cell of claim 10, wherein the conditional keeper block includes logic circuitry including
 a first input coupled to an output of the logic gate of the clock trigger block,
 a second input configured to receive a signal indicative of the logic level of the enable signal,
 a third input configured to receive the first oscillating clock signal, and
 a fourth input coupled to an output of a second inverter.

12. The clock gate cell of claim 11, wherein the second inverter has an input coupled to the output of the logic circuitry.

13. The clock gate cell of claim 11, wherein the logic circuitry of the conditional keeper block is coupled to an output of a second logic gate that receives the enable signal at an input thereof.

14. The clock gate cell of claim 11, wherein the logic circuitry includes one of AND-OR-invert circuitry and OR-AND-invert circuitry.

15. A method, comprising:
 receiving a first clock signal at a clock gate cell; and
 disabling the clock gate cell in response to receiving an enable signal having a first logic level,
 wherein the clock gate cell includes a plurality of transistors, and
 wherein, when the clock gate cell is disabled, at least one but fewer than one half of the plurality of transistors toggle in response to the receiving of the first clock signal.

16. The method of claim 15, wherein the clock gate cell includes
 a clock trigger block configured to receive the first clock signal; and
 a conditional keeper block configured to output a signal to the clock trigger block based on a logic level of an enable signal and the first clock signal.

17. The method of claim 16, further comprising enabling the clock gate cell such that the clock gate cell outputs a second clock signal.

18. The method of claim 17, wherein the clock gate cell includes
 a phase adapt block coupled to the output of the clock trigger block, the phase adapt block configured to receive a third clock signal from the clock trigger block and to output the second clock signal in response.

* * * * *